United States Patent
Kawasaki

(10) Patent No.: US 8,748,850 B2
(45) Date of Patent: Jun. 10, 2014

(54) ENERGY APPLICATION DEVICE AND ENERGY APPLICATION METHOD

(75) Inventor: Kimihiko Kawasaki, Tokyo (JP)

(73) Assignee: Lintec Corporation, Tokyo (JP)

( * ) Notice: Subject to any disclaimer, the term of this patent is extended or adjusted under 35 U.S.C. 154(b) by 255 days.

(21) Appl. No.: 13/389,143

(22) PCT Filed: Aug. 2, 2010

(86) PCT No.: PCT/JP2010/063038
§ 371 (c)(1),
(2), (4) Date: Feb. 6, 2012

(87) PCT Pub. No.: WO2011/016427
PCT Pub. Date: Feb. 10, 2011

(65) Prior Publication Data
US 2012/0132831 A1 May 31, 2012

(30) Foreign Application Priority Data
Aug. 7, 2009 (JP) ................. 2009-184637

(51) Int. Cl.
*A61N 5/00* (2006.01)
*G21G 5/00* (2006.01)

(52) U.S. Cl.
USPC .............. 250/492.1; 250/492.2; 250/492.22; 250/504 R; 250/454.11; 430/325; 430/190; 430/191

(58) Field of Classification Search
USPC .............. 250/492.1, 492.2, 492.22, 504 R, 250/454.11; 430/325, 190, 191
See application file for complete search history.

(56) References Cited

U.S. PATENT DOCUMENTS

| | | |
|---|---|---|
| 2005/0245047 A1 | 11/2005 | Maas et al. |
| 2008/0011427 A1 | 1/2008 | Maas et al. |
| 2008/0206570 A1* | 8/2008 | Ito et al. ............. 428/411.1 |
| 2010/0043964 A1 | 2/2010 | Narita |

FOREIGN PATENT DOCUMENTS

| | | |
|---|---|---|
| CN | 101464599 A | 6/2009 |
| JP | A-09-162141 | 6/1997 |
| JP | A-2000-063773 | 2/2000 |
| JP | A-2001-266419 | 9/2001 |
| JP | A-2005-538205 | 12/2005 |
| JP | A-2007-329300 | 12/2007 |
| WO | WO 2008/038413 A1 | 4/2008 |

OTHER PUBLICATIONS

Mar. 13, 2012 International Preliminary Report on Patentability issued in International Patent Application No. PCT/JP2010/063038.
Jul. 26, 2013 Office Action issued in Chinese Patent Application No. 201080034901.2 (with partial translation).
International Search Report issued in International Application No. PCT/JP2010/063038 dated Oct. 26, 2010 (with translation).

* cited by examiner

*Primary Examiner* — Jack Berman
*Assistant Examiner* — Meenakshi Sahu
(74) *Attorney, Agent, or Firm* — Oliff PLC

(57) ABSTRACT

An energy application device applies optical energy on an adhesion sheet by a light radiator and, subsequently, applies heat energy on the adhesion sheet by a heater. With this arrangement, even the adhesion sheet, which includes an adhesive layer having an energy barrier that cannot be overcome only with optical energy, is enabled to start a photoreaction by overcoming an energy barrier with the heat energy from the heater.

5 Claims, 4 Drawing Sheets

ENERGY APPLICATION DEVICE AND ENERGY APPLICATION METHOD

TECHNICAL FIELD

The present invention relates to an energy application device that radiates light to a photoreactive object to allow the object to photoreact, and an energy application method.

BACKGROUND ART

In a processor for a semiconductor wafer (hereinafter, simply referred to as a wafer), processes such as one in which a protective tape is attached to a surface of a circuit of the wafer for back grind, and one in which a dicing tape is attached to divide the wafer into a plurality of chips are performed. An adhesive of a tape used for such processes is optically curable (photoreactive). After the above processes, light is radiated on the tape by an energy application device to cure the adhesive (photoreaction of the adhesive) to weaken adhesive force, thereby facilitating peeling the tape without damaging the wafer (see, Patent Literature 1).

A light-emitting-diode attachment member of an ultraviolet irradiator of Patent Literature 1 is provided with an ultraviolet light-emitting diode arranged in a line, a cylindrical lens that collects light of the ultraviolet light-emitting diode to radiate the light on the wafer, and a cooling fan that cools the light-emitting-diode attachment member. The ultraviolet irradiator transfers the light-emitting-diode attachment member heated by lighting-up of the ultraviolet light-emitting diode while the light-emitting-diode attachment member being cooled by the cooling fan, whereby ultraviolet rays collected by the cylindrical lens are radiated over the entire surface of an adhesive tape.

CITATION LIST

Patent Literature

Patent Literature 1 JP-A-2007-329300

SUMMARY OF THE INVENTION

Problems to be Solved by the Invention

In a configuration such as one of the ultraviolet irradiator of Patent Literature 1 in which only energy of ultraviolet rays is applied on an adhesion sheet (adhesive tape), such a disadvantage was found that an adhesive layer of the adhesion sheet may not be cured enough to be easily peeled off without damaging the wafer. For this reason, development of a method for appropriately curing the adhesive layer of the adhesion sheet has been demanded.

The invention is devised in view of the above disadvantage. An object of the invention is to provide an energy application device capable of allowing a photoreactive object to appropriately photoreact, and an energy application method.

Means for Solving the Problems

As a result of intense study for achieving the above object, the inventors found out that even an adhesive layer unable to be appropriately cured by the ultraviolet irradiator of Patent Literature 1 can be appropriately cured by a light irradiator using a high-pressure mercury lamp. Consequently, the inventors found out that the ultraviolet irradiator as in Patent Literature 1 can only apply optical energy on the adhesive layer, but the high-pressure mercury lamp applies heat energy in addition to optical energy on the adhesive layer, so that the adhesive layer is cured. Specifically, the inventors found out that the level of optical energy only reaches 98 no matter how much optical energy is radiated on an adhesive layer that starts a curing reaction by being applied with energy, for instance, at the level of 100 or more. However, the inventors found out that the adhesive layer is enabled to be cured by being applied with heat energy in addition to the optical energy, i.e., energy at the level of 100 or more as a whole. Such a phenomenon is supported by a phenomenon that, although water may not freeze even at 0 degree when water is slowly cooled, water momentarily freezes by overcoming energy barrier with energy by shock. The invention is based on the aforementioned finding.

Accordingly, an energy application device according to an aspect of the invention radiates light on a photoreactive object to allow the object to photoreact and includes a first energy application unit that applies optical energy having a predetermined wavelength on the object, and a second energy application unit that applies energy other than optical energy or optical energy having a wavelength other than the predetermined wavelength as a second energy on the object.

In the energy application device according to the above aspect of the invention, it is preferred that the object is photoreactive to ultraviolet rays and the first energy application unit applies ultraviolet rays having a predetermined wavelength.

Moreover, in the energy application device according to the above aspect of the invention, it is preferred that the object is an adhesion sheet having an ultraviolet-curable adhesive layer and attached to a semiconductor wafer.

Further more, in the energy application device according to the above aspect of the invention, it is preferred that the first energy application unit applies optical energy generated by at least one light-emitting diode on the object.

In the energy application device according to the above aspect of the invention, it is preferred that the second energy application unit applies at least one energy of heat, vibration, sound, ultrasonic waves, electron beam, gamma rays, X rays and infrared rays as the second energy.

According to another aspect of the invention, an energy application method of radiating light on a photoreactive object to allow the object to photoreact and includes: by a first energy application unit that generates optical energy having a predetermined wavelength on the object, and a second energy application unit that generates energy other than optical energy or optical energy having a wavelength other than the predetermined wavelength as a second energy, a first energy application step in which the first energy from the first energy application unit is applied on the object; and a second energy application step in which the second energy from the second energy application unit is applied on the object.

In the energy application method according to the above aspect of the invention, it is preferred that the second energy application unit generates at least one energy of heat, vibration, sound, ultrasonic waves, electron beam, gamma rays, X rays and infrared rays as the second energy.

According to the above aspect of the invention, the object that is unable to photoreact with optical energy having a predetermined wavelength, which alone is not sufficient for energy required for cure (hereinafter, simply referred to as curing energy), in other words, that is unable to overcome an energy barrier only with optical energy with a single wavelength can be appropriately cured by overcoming the energy barrier by being applied with energy other than optical energy or optical energy having a wavelength other than the predetermined wavelength as the second energy before, after or during application of the optical energy having the predetermined wavelength.

Moreover, when ultraviolet rays are applied as optical energy on an object that starts a photoreaction by ultraviolet rays, the object can appropriately photoreact. Furthermore, when the object is an adhesion sheet having an adhesive layer and attached to a semiconductor wafer, the adhesion sheet attached to the wafer can be easily peeled off so as not to damage the wafer by being appropriately cured after a predetermined process. When a light-emitting diode is used as the first energy application unit, electric power saving and long lifetime of the energy application device can be realized. Even when at least one energy of heat, vibration, sound, ultrasonic waves, electron beam, gamma rays, X rays and infrared rays is applied as the second energy, the object can appropriately photoreact.

EXEMPLARY EMBODIMENTS OF THE INVENTION

A first exemplary embodiment of the invention will be described below with reference to the attached drawings.

Figure 1:
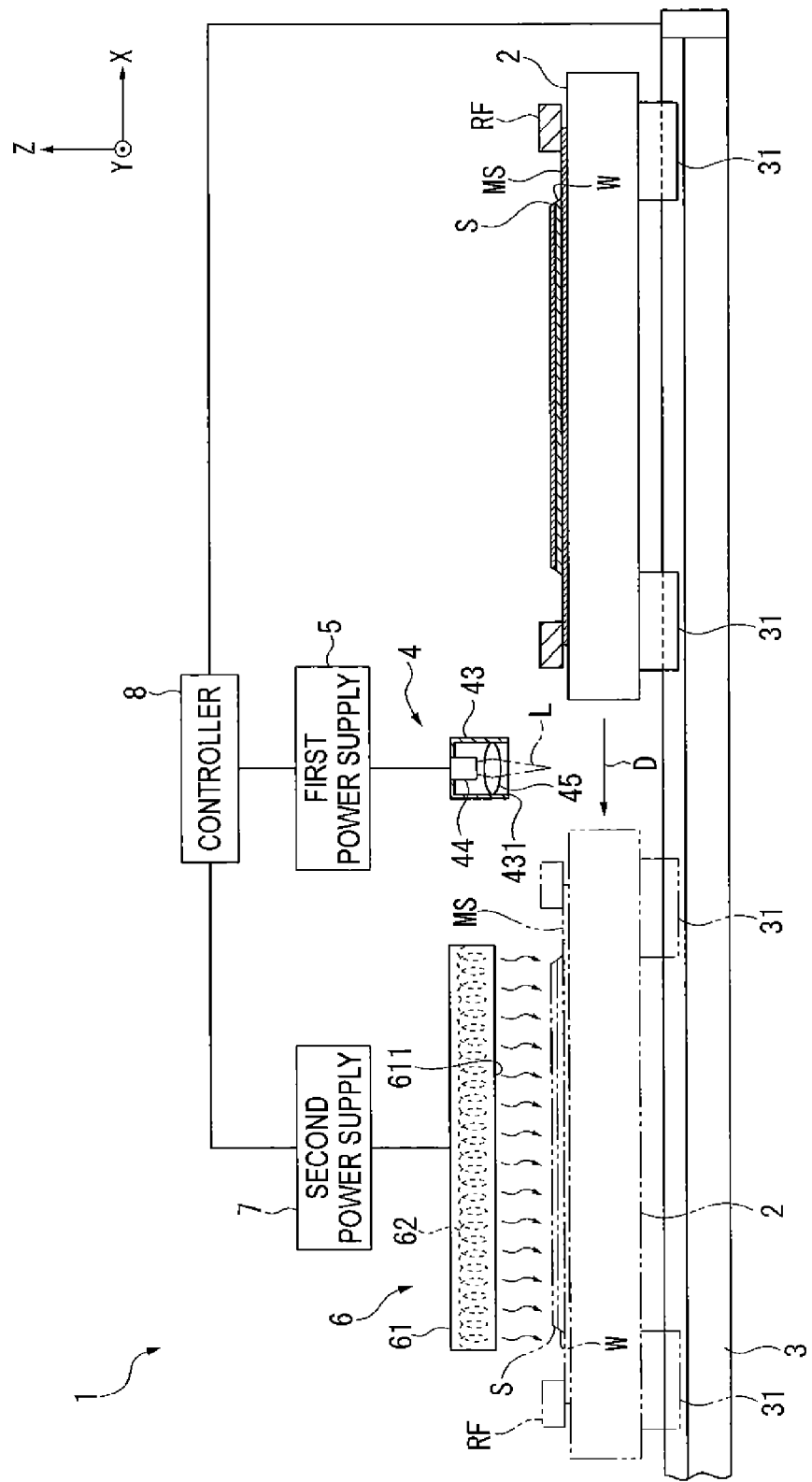
FIG. 1 is a side view of an energy application device according to a first exemplary embodiment of the invention.

In FIG. 1, an energy application device 1 is a device that radiates light on an adhesion sheet S (an object) attached to a surface of a wafer W. The energy application device 1 includes a table 2 that holds the wafer W integrated with a ring frame RF via a mounting sheet MS, a single-spindle robot 3 that is provided under the table 2, a light radiator 4 (a first energy application unit) that radiates light on the adhesion sheet S, a first power supply 5 that supplies electricity to the light radiator 4, a heater 6 (a second energy application unit) that heats the adhesion sheet S, a second power supply 7 that supplies electricity to the heater 6, and a controller 8 that controls the single-spindle robot 3 and the first and second power supplies 5 and 7.

The adhesion sheet S is an adhesion sheet having an ultraviolet-curable (photoreactive) adhesive layer. The adhesive layer is designed so as to start curing (photoreaction) with radiation of approximately 365-nm light.

The table 2 includes a suction opening (not shown) and is configured to be capable of sucking and holding the wafer W and the ring frame RF through the mounting sheet MS. The single-spindle robot 3 has a slider 31 fixed to a lower surface of the table 2. The single-spindle robot 3 is configured to slide the table 2 in an X-axis direction (right-left direction in FIG. 1) via the slider 31.

Figure 2:
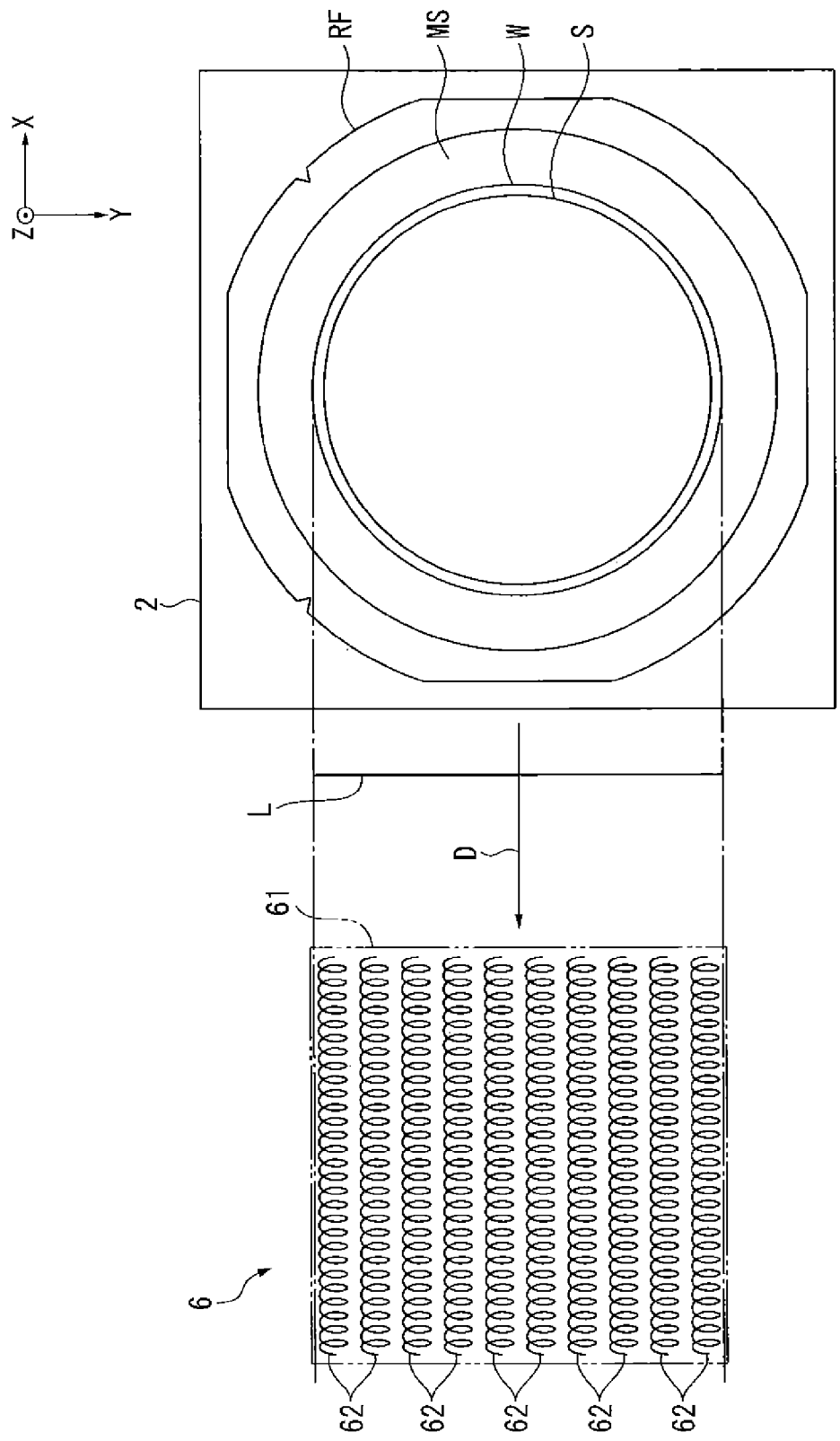
FIG. 2 is an illustration for explaining a positional relationship between linear light, a heater and a wafer.

The light radiator 4 includes a frame 43 that is cross-sectionally shaped in square C and longitudinally aligned with a Y-axis direction, a plurality of LEDs (Light Emitting Diodes) (a light emitting source) that are arrayed in the Y-axis direction inside the frame 43, and a cylindrical lens 45 that is positioned in an opening 431 of the frame 43 (on a lower side in FIG. 1) in a manner to be opposed to all the LEDs 44. All the LEDs 44 emit light (ultraviolet light) having a peak wavelength of a 365-nm single wavelength (a first energy). The emitted light is collected by the cylindrical lens 45 to form a linear light L extending in the Y-axis direction (in a direction perpendicular to a moving direction of the table 2) on a surface coplanar with a surface of the adhesive layer of the adhesion sheet S as shown in FIG. 2. It should be noted that the adhesive layer, although having a thickness in a precise sense, is referred to as a surface since the adhesive layer having a thickness of several tens μm is extremely thin relative to a width of the linear light L. The light of a single wavelength in the invention may slightly include light having a wavelength of less than or more than 365 nm in addition to a wavelength of 365 nm.

The heater 6 is provided on the left of the light radiator 4 in FIG. 1. The heater 6 includes a coil 62 provided inside a heat insulating plate 61 having an opening 611 on the lower side in FIG. 1 and generates heat as a second energy.

Next, an operation of light radiation by the energy application device 1 will be described.

First, while the adhesion sheet S is attached on a circuit surface (the upper side in FIG. 1) by a transfer unit (not shown), the wafer W integrated with the ring frame RF via the mounting sheet MS is mounted on the table 2 that is stopped at a position shown by a solid line in FIG. 1, from an opposite side of the circuit surface. After mounting, the table 2 sucks and holds the wafer W and the ring frame RF from the side of the mounting sheet MS by the suction opening (not shown).

After confirmation of this suction/holding, the controller 8 outputs a command signal to instruct the first and second power supplies 5 and 7 to supply electricity respectively to the light radiator 4 and the heater 6. Then, in the light radiator 4, LEDs 44 emit light of a 365-nm single wavelength (ultraviolet light) to form linear light L. The coil 62 of the heater 6 starts heating.

The controller 8 controls the single-spindle robot 3 to move the table 2 in an arrow D direction, whereby the adhesion sheet S mounted on an upper surface of the table 2 crosses the linear light L, so that optical energy (ultraviolet energy) of a 365-nm wavelength is applied on the entire surface of the adhesion sheet S (first energy application step).

Thereafter, when the table 2 is kept being moved in the arrow D direction, the adhesion sheet S mounted on the upper surface of the table 2 passes under the heater 6, so that heat energy is applied on the entire surface of the adhesion sheet S (second energy application step).

Thus, the adhesive layer of the adhesion sheet S is cured by receiving optical energy (the first energy) and heat energy (the second energy).

Subsequently, the wafer W integrated with the ring frame RF is transferred to an adhesion sheet peeling device or the like via the transfer unit (not shown). After adhesion sheet S is peeled off, the wafer W is transferred to a dicing step or the like.

According to the first exemplary embodiment, the following advantages are obtainable.

The energy application device 1 applies heat energy to the adhesion sheet S after applying optical energy. Accordingly, even when optical energy is not enough to cure the adhesive layer, the energy application device 1 can appropriately cure the adhesive layer of the adhesion sheet S by overcoming an energy barrier with the heat energy supplied to the adhesion sheet S as another energy.

Next, a second exemplary embodiment of the invention will be described below with reference to the attached drawings.

Figure 3:
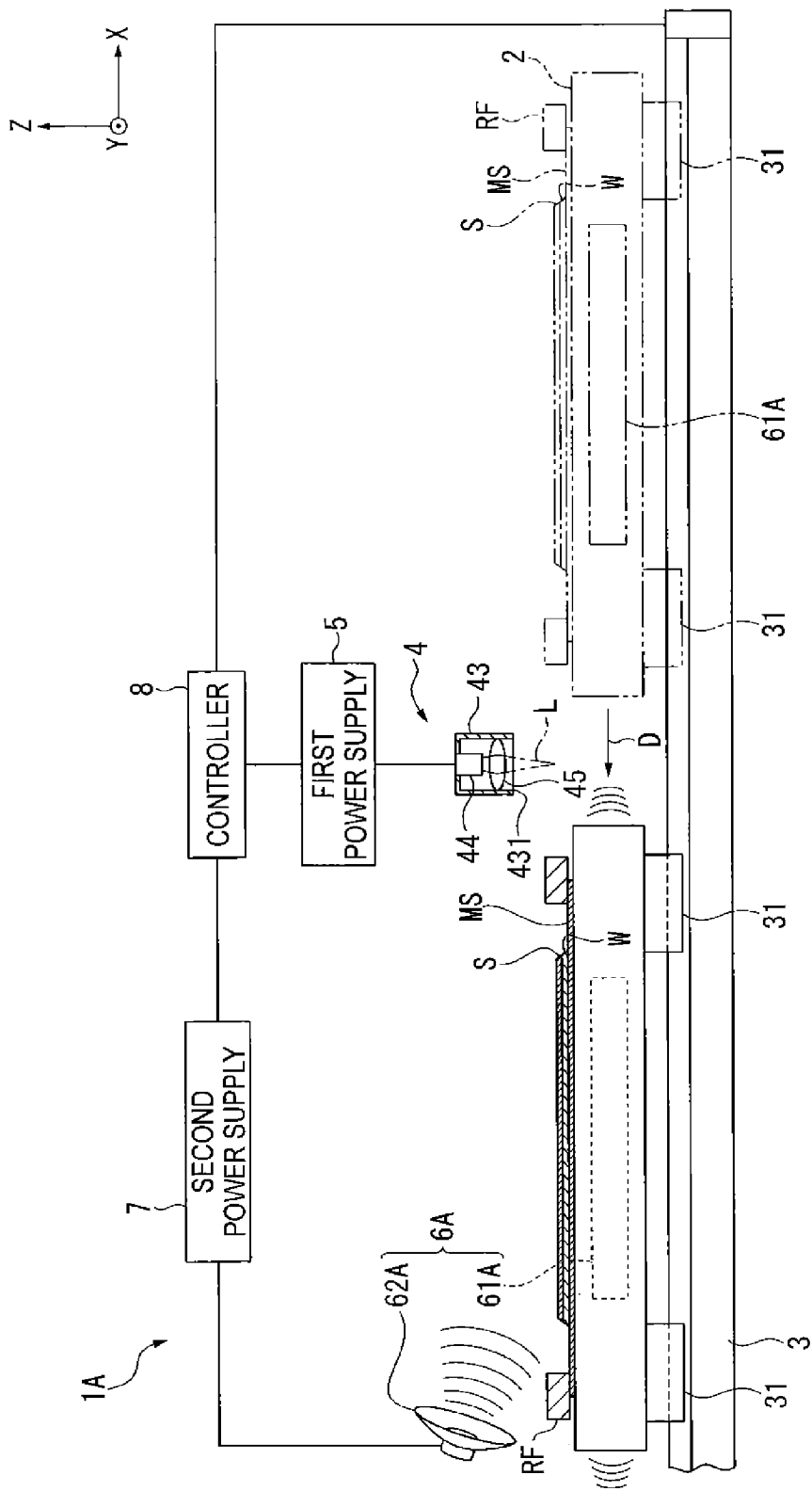
FIG. 3 is a side view of an energy application device according to a second exemplary embodiment of the invention.

FIG. 3 is a side view of an energy application device 1A according to the second exemplary embodiment.

The energy application device 1A according to the second exemplary embodiment is different from the energy application device 1 according to the first exemplary embodiment in that a vibration generator 6A is provided in place of the heater 6 as the second energy application unit.

The vibration generator 6A is exemplified by a vibrating body 61A provided in the table 2 and a speaker 62A provided over the table 2. The speaker 62A and the vibrating body 61A generate sound waves and vibration with electricity supplied by the second power supply 7. The sound waves and vibration provide vibrational energy (i.e., the second energy) to the adhesion sheet S attached to the wafer W on the table 2. As the vibrating body 61A, known ultrasonic vibrator, vibrator using an electric motor or air, and the like are applicable.

In the same manner as in the first exemplary embodiment, optical energy (ultraviolet energy) of a 365-nm wavelength is applied as the first energy on the entire surface of the adhesion sheet S by the light radiator 4. Subsequently, vibrational energy is applied as the second energy on the adhesion sheet S by the vibration generator 6A (the second energy application step), so that the adhesive layer of the adhesion sheet S is appropriately curable by overcoming an energy barrier.

According to the second exemplary embodiment, the following advantages are obtainable.

The energy application device 1A applies heat energy to the adhesion sheet S after applying optical energy. Accordingly, even when optical energy is not enough to cure the adhesive layer, the energy application device 1A can appropriately cure the adhesive layer of the adhesion sheet S by overcoming an energy barrier with vibrational energy supplied to the adhesion sheet S as another energy.

EXAMPLES

Next, Examples according to the invention will be described.

Comparative Example 1

In Comparative Example 1, adhesive force was evaluated when an adhesive layer of a dicing tape (adhesion sheet) was optically cured by light having a plurality of wavelengths including 365 nm.

First, a dicing tape (manufactured by Lintec Corporation, model: D-210, width: 25 mm) was attached to a stainless steel plate by a sheet attachment device (manufactured by Lintec Corporation, model: RAD-3510) (dicing-tape attachment step).

Next, the dicing tape attached to the stainless steel plate was irradiated with light having a plurality of wavelengths including 365 nm by an ultraviolet irradiator (manufactured by Lintec Corporation, model: RAD-2000) (multi-wavelength light irradiation step).

The dicing tape was peeled off from the stainless steel plate by a pull/compression testing machine (manufactured by A & D Company, Limited, model: RTD-1225). Adhesive force of the dicing tape was evaluated when the dicing tape was peeled off (evaluation step). Samples were prepared using different light intensities in the multi-wavelength light irradiation step and evaluated in the same manner as the above. The adhesive force was measured according to JIS Z 0237 testing method (peeling speed: 300 mm/min, peeling angle: 180 degrees).

Figure 4:
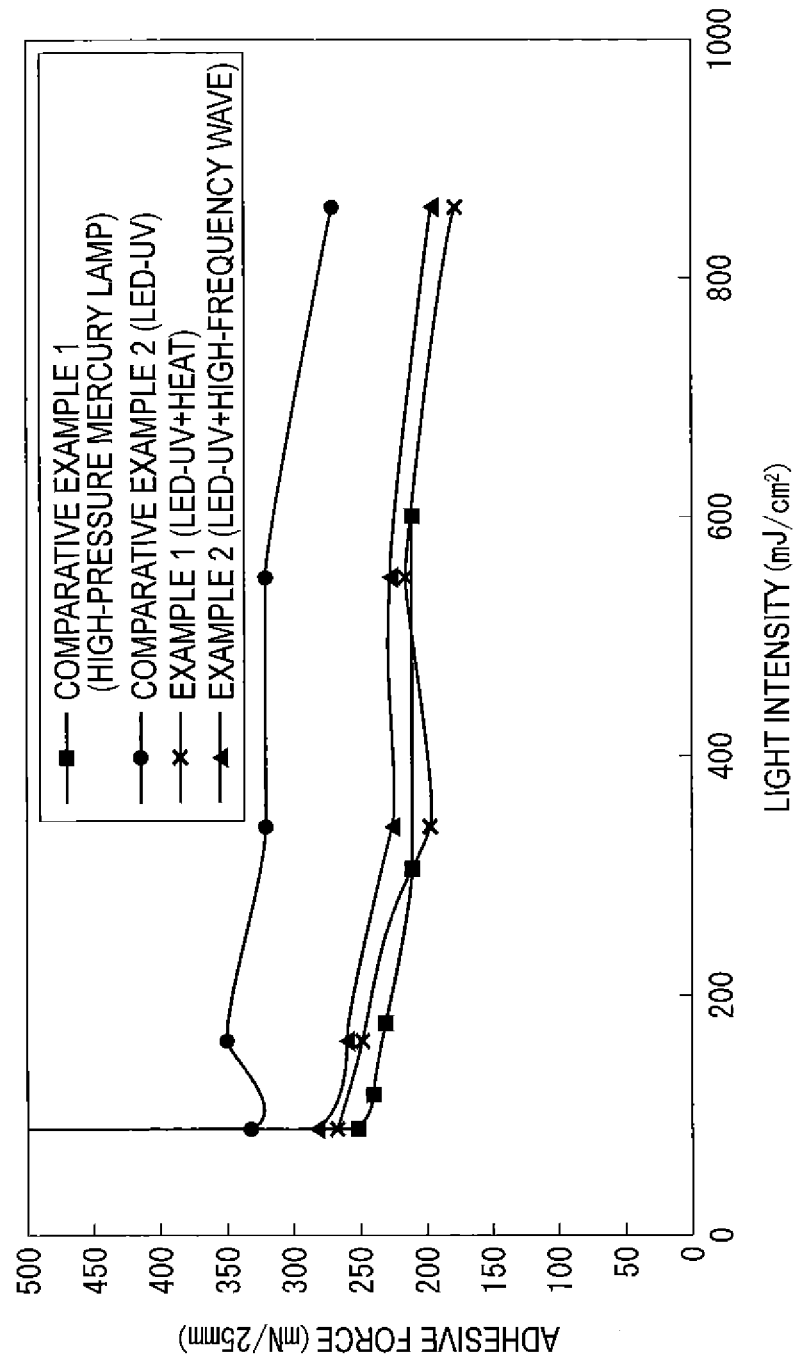
FIG. 4 is a graph showing a relationship between light intensity of a light source that radiates light on a dicing tape and adhesive force of the dicing tape in Examples of the invention.

As shown in FIG. 4, the adhesive force was fluctuated in a range of 200 to 250 mN/25 mm.

Comparative Example 2

In Comparative Example 2, adhesive force was evaluated when an adhesive layer of a dicing tape was optically cured by light having a single wavelength of 365 nm.

First, the dicing tape attached to the stainless steel plate in the dicing-tape attachment step in the same manner as in Comparative Example 1 was irradiated with light having a single wavelength of 365 nm by a high-power UV-LED irradiator (manufactured by KEYENCE CORPORATION, model: UV-400) (single-wavelength light irradiation step).

Adhesive force was evaluated in the evaluation step in the same manner as in Comparative Example 1. Samples were prepared using different light intensities in the single-wavelength light irradiation step and evaluated in the same manner as the above.

As shown in FIG. 4, the adhesive force was fluctuated in a range of 300 and 350 mN/25 mm, which was higher than that of Comparative Example 1.

Example 1

In Example 1, adhesive force was evaluated when an adhesive layer of a dicing tape was optically cured by light having a single wavelength of 365 nm and heat.

First, the dicing tape attached to the stainless steel plate in the dicing-tape attachment step and the single-wavelength light irradiation step in the same manner as in Comparative Example 2 was irradiated with light having a single wavelength of 365 nm.

Subsequently, the dicing tape was heated by a spot heater (manufactured by TAKETSUNA MANUFACTORY CO., LTD., model: SH01/1100-035K) and evaluated in the evaluation step in the same manner as in Comparative Examples 1 and 2. Samples were prepared using different light intensities in the single-wavelength light irradiation step and evaluated in the same manner as the above.

As shown in FIG. 4, the adhesive force was fluctuated in a range of 180 and 260 mN/25 mm, which was equivalent to that of Comparative Example 1.

Example 2

In Example 2, adhesive force was evaluated when an adhesive layer of a dicing tape was optically cured by light having a single wavelength of 365 nm and high-frequency wave.

First, the dicing tape attached to the stainless steel plate in the dicing-tape attachment step and the single-wavelength light irradiation step in the same manner as in Comparative Example 2 and Example 1 was irradiated with light having a single wavelength of 365 nm.

Subsequently, high-frequency wave was applied on the stainless steel plate attached with the dicing tape by a high-frequency wave generator (manufactured by HIDEC Co., Ltd., model: DIHS105-MT1) and evaluated in the evaluation step in the same manner as in Comparative Examples 1 and 2 and Example 1. Samples were prepared using different light intensities in the single-wavelength light irradiation step and evaluated in the same manner as the above.

As shown in FIG. 4, the adhesive force was fluctuated in a range of 230 and 270 mN/25 mm, which was equivalent to that of Comparative Example 1.

Although the best arrangement and method for implementing the invention has been disclosed above, the invention is not limited thereto. In other words, while the invention has been described with reference to the specific embodiments and the drawings thereof, various modifications may be made on shapes, materials, quantities and other specific configurations to the disclosed exemplary embodiments by those of ordinary skill in the art without departing from the spirit and scope of the invention. Therefore, the description limiting the shapes and the materials disclosed above is intended to be illustrative for easier understanding and not to limit the invention, hence the invention includes the description using a name of component without a part of or all of the limitation on the shapes and the materials etc.

Specifically, LEDs 44 in the first and second exemplary embodiments may be replaced by light emitting source that radiates light having a plurality of wavelengths. The second energy application unit that applies optical energy having a wavelength different from the optical energy of LEDs 44 or energy of sound (sound waves), ultrasonic waves, magnetic force, electron beam, gamma rays, X rays and infrared rays as the second energy may be provided. The second energy is not limited to the above. Any energy except for the optical energy generated by the first energy application unit of the invention may be applied. The second energy may be applied while supplying the optical energy or after the optical energy is applied. Moreover, not the linear light L but diffused light may be radiated.

Only the light radiator 4 and speaker 62A may be moved relative to the table 2. Alternatively, the light radiator 4 and speaker 62A may be moved while the table 2 is moved. Infrared rays and visible light, which have a wavelength of a value different from the above values, may be applied as optical energy. Light may be formed to have a further different wavelength. A xenon flash, a metal halide lamp, a fluorescent light and the like may be applied as the light emitting source. As long as the object is photoreactive, any object may be used.

The invention claimed is:

1. An energy application device that radiates light on a photoreactive object to allow the object to photoreact, the energy application device comprising:
   a first energy application unit that applies on the object optical energy having a predetermined wavelength at which the object starts to be photoreacted; and
   a second energy application unit that applies on the object a second energy for overcoming an energy barrier of the object that cannot be overcome by the optical energy having the predetermined wavelength alone, wherein
   the second energy is an energy other than heat, the second energy being at least one of energies selected from the group consisting of vibrations, sound, ultrasonic waves magnetic force, electron beam, gamma rays, X rays and optical energy having a wavelength different from the predetermined wavelength.

2. The energy application device according to claim 1, wherein
   the object is photoreactive to ultraviolet rays, and
   the first energy application unit applies ultraviolet rays having a predetermined wavelength.

3. The energy application device according to claim 1, wherein
   the first energy application unit applies optical energy generated by at least one light-emitting diode on the object.

4. An energy application method of radiating light on a photoreactive object to allow the object to photoreact, the energy application method comprising:
   by a first energy application unit that generates optical energy having a predetermined wavelength at which the object starts to be photoreacted and a second energy application unit that generates a second energy for overcoming an energy barrier of the object that cannot be overcome by the optical energy having the predetermined wavelength alone, a first energy application step in which the optical energy having the predetermined wavelength from the first energy application unit is applied on the object; and
   a second energy application step in which the second energy other than heat from the second energy application unit is applied on the object, the second energy being at least one of energies selected from the group consisting of vibrations, sound, ultrasonic waves, magnetic force, electron beam, gamma rays, X rays and optical energy having a wavelength different from the predetermined wavelength.

5. The energy application device according to claim 2, wherein
   the first energy application unit applies optical energy generated by at least one light-emitting diode on the object.

* * * * *